United States Patent [19]

St. Pierre

[11] Patent Number: 5,390,081
[45] Date of Patent: Feb. 14, 1995

[54] FAULT-TOLERANT POWER DISTRIBUTION SYSTEM FOR RACK-MOUNTED HARDWARE

[75] Inventor: Keith St. Pierre, Stow, Mass.

[73] Assignee: Stratus Computer, Inc., Marlboro, Mass.

[21] Appl. No.: 34,145

[22] Filed: Mar. 22, 1993

[51] Int. Cl.⁶ ............................................. H01R 9/00
[52] U.S. Cl. .................... 361/775; 361/752; 361/792; 361/805; 439/45; 439/64; 439/75
[58] Field of Search ............ 361/775, 784, 788, 792, 361/805, 744, 748, 752, 785, 810; 439/45, 64, 48, 74, 75; 174/255; 29/837, 850

[56] References Cited

U.S. PATENT DOCUMENTS

| | | |
|---|---|---|
| 3,162,500 | 4/1962 | Pittman . |
| 3,208,028 | 4/1963 | Mittler et al. . |
| 3,212,048 | 4/1963 | Rosenberg et al. . |
| 3,252,056 | 7/1963 | Poesl . |
| 3,292,131 | 12/1963 | Porch . |
| 3,923,359 | 7/1972 | Newsam ........................... 339/17 M |
| 4,241,381 | 12/1980 | Cobaugh et al. .................... 361/413 |
| 4,492,419 | 1/1982 | Denckert ........................... 339/18 C |
| 4,567,654 | 6/1985 | Kloenne et al. .................... 29/876 |
| 4,869,673 | 9/1989 | Kreinberg et al. .................. 439/64 |
| 5,017,145 | 5/1991 | Kanai et al. ....................... 439/45 |
| 5,070,430 | 12/1991 | Meusel et al. ...................... 361/407 |

FOREIGN PATENT DOCUMENTS 0074303 3/1983 European Pat. Off. .
3826460 2/1990 Germany .

OTHER PUBLICATIONS

IBM Corp., "Programmable Power and Ground Interconnection Method," *IBM Technical Disclosure Bulletin*, vol. 33, pp. 11-12, Feb. 1991.

Primary Examiner—Leo P. Picard
Assistant Examiner—Young Whang
Attorney, Agent, or Firm—Lahive & Cockfield

[57] ABSTRACT

Fault-tolerant power distribution system for back-mounted hardware in which a backplane arrangement delivers alternative sources of system power in a prioritized pattern to each of a plurality of fault-tolerant electronic cards via a plurality of system slots, each slot including a power port having electrical contacts in a common system pinout, and the cooperating system cards have electrical contacts in the same common system pinout. Any of the system cards can be installed in any system slot and will receive the system power in one of a plurality of fault-tolerant prioritizations. A streamlined power distribution system has a circuit-board-like system power bus backplane arrangement providing the system slots and power ports in which a plurality of conductive pins at each port are disposed in a common system configuration for cooperation with system fault-tolerant cards, and further in which a plurality of power plates, a ground plate and an exposed contact plate, are selectively coupled via these pins in a low-profile, space-saving configuration.

19 Claims, 3 Drawing Sheets

FAULT-TOLERANT POWER DISTRIBUTION SYSTEM FOR RACK-MOUNTED HARDWARE

BACKGROUND OF THE INVENTION

The present invention is directed to power distribution apparatus, and, more particularly, to power delivery systems for rack-mounted equipment.

Many present day electronic systems, such as computers, typically include a central processor board (CPU) and one or several memory devices, interfaced with various peripheral devices via various system cards, such as input/output cards, communication cards, etc. Data signals are communicated between the CPU, memory devices and cards via a data bus. Electrical power is typically provided over a power bus. Each of these busses may be a stand-alone structure or a portion of a larger system bus structure.

In rack-mounted computer equipment, a plurality of card-receiving slots are defined on a so-called "backplane" structure, and the system bus supplies system power, connecting the CPU to these slots through the backplane. For this purpose, each slot typically includes a female edge connector disposed for receipt of the male edge connector of the board or card to be inserted thereat.

The various electronic circuits of the CPU, memory devices and installed cards can place substantial demands on system power. In systems having high power requirements, the system power bus typically has a bulky design. Connection of system components to these bulky power busses can be difficult in confined locations, such as where package size has been minimized. Furthermore, in fault-tolerant computer systems, duplication of hardware and system functions again makes power requirements and space limitations of concern.

It is therefore an object of the present invention to provide improved apparatus for delivery of power to fault-tolerant cards in a rack-mounted system.

It is another object of the present invention to provide streamlined fault-tolerant power distribution in rack-mounted equipment.

SUMMARY OF THE INVENTION

The present invention provides improvements in fault-tolerant distribution of power in a rack-mount system. In one aspect of the invention, a backplane defines a system power bus and a plurality of card-receiving slots. Each slot defines a power port for coupling a received card to the system power bus, and in turn the system power bus couples both a source of system "A" power and a source of system "B" power to each power port. Therefore, for example, a communications card installed in any of the power ports receives both system A power and system B power via the system power bus.

In another aspect of the invention, each port has a common system pinout in a fault-tolerant configuration for provision of both primary power and secondary power to a received card. In this common system pinout, the power at the first contact of each port and first contact of each card is defined as system primary power and the power at the second contact of each port and the second contact of each card is defined as system secondary power. But for any one port, the primary power may be either the A power or the B power because system A and B power are each applied as either the primary or secondary power depending upon a prioritization arrangement of the backplane. (System ground is always applied to the third contact of the port and of the installed card.)

Thus, for example, in a fault-tolerant embodiment of the invention, the aforesaid communications card is installed in a first port of the system and receives system A power on its first contact as primary power and system B power on its second contact as secondary power, while a second identical communications card is installed in a second port and receives system B power on its first contact as primary power and system A power on its second contact as secondary power. This arrangement thus provides fault-tolerant power distribution in a fault-tolerant computer system.

In another aspect of the invention, the backplane has a first power-carrying bus plate coupled to the A power source, a second power-carrying bus plate coupled to the B power source, and a third bus plate coupled to ground. These plates are metalized and perforated. Each of the first, second and third contacts of the ports are defined by the ends of respective conductive pins inserted through the plate perforations. However, only selected perforations are metalized, so that a pin only makes contact with the metalization of an assigned plate. Thus a prioritized power-delivery pattern is established in which the first power-carrying bus plate is connected to the primary power contact of a first of the ports, and the second power-carrying bus plate is connected to the secondary power contact of that first power port, while the second power-carrying bus plate is connected to the primary power contact of a second one of the ports and the first power-carrying bus plate is connected to the secondary power contact of this second port. Additional power ports are connected consistent with this prioritized pattern.

For example, if B power is to be present at the first (primary) power pin of port 4, then pin one of port 4 penetrates all of the plates and makes contact with the metalization layer of the B power plate, but not of the metalization of the other power plates. Furthermore, in this example, the second (secondary) power pin would only make contact with the metalization layer of the A power plate, and the third pin would only make contact with the ground plate metalization. But another port, such as port 3, has an alternative power arrangement, where A power is at the primary power pin and B power is at the secondary power pin. Therefore, where two identical fault-tolerant memory cards are installed in neighboring ports, one will receive A power and one will receive B power as primary power. Advantageously, this fault-tolerant power delivery adds extra security to a fault-tolerant computer system.

In yet another aspect of the invention, an unmetalized perforated plate forms a contact plate on the exposed face of the backplane, and the first power plate, the second power plate, the ground plate and the contact plate are mounted together as parallel layers of a multilayer backplane. The exposed contact plate provides for definition of the backplane power ports, with the ends of the conductive pins forming the power contacts of each power port in the desired common system pinout at the surface of the contact plate.

The connection pattern of the aforesaid conductive pins with the power plates, and presentation of the pins in the common system pinout, enables any one of the cards of the system to be inserted into any one of the system power ports and to receive primary system power on a first assigned contact of the card's edge connector and secondary system power on a second assigned contact of the edge connector from selected ones of the power plates according to the connections made by the associated conductive pins with the power plates in the common system pinout.

In another aspect of the invention, the above fault-tolerant power delivery arrangement is beneficially utilized by fault-tolerant cards of the system. Each card has a circuit design for defining primary system power received on a first of its power contacts as primary circuit power and secondary system power received on a second of its power contacts as back-up or secondary circuit power, and for switching circuit power from the primary circuit power to the secondary circuit power upon detection of a fault in the received primary system power. Thus, for example, one of the aforesaid communications card installed in any of the ports looks at the power received on its first port as primary power and uses it as primary circuit power unless it detects a fault in that received power, at which time it switches to the secondary power at its second contact for use as primary circuit power. As well, if a power fault is detected, a power fault warning is issued to the system operator to indicate a fault in the power supplied to the primary power pin of the port in question. But the fault-tolerant system continues operation without interruption.

In another aspect of the invention, a streamlined power distribution system is provided. In a conventional system power bus design, the height of a bus bar is adjusted to meet system current density requirements, but this can be at a loss of system package compactness where the height of the system package is designed to accommodate the height of the power bus. Meanwhile, in the present invention, a multi-layer circuit-board-like system power bus backplane arrangement is provided in a low-profile, space-saving configuration. This new backplane arrangement has a lower height dimension, dictated only by the height of its circuit board configuration, yet its width is increased substantially compared to a conventional power bus bar so as to still meet current density requirements. This width expansion is at no expense to system package width, since this expanded backplane width is still less than the package width which is already required by the width of other system components. For example, the backplane A power plate, B power plate, ground plate and face plate each are thin and wide, and when stacked, are circuit-board-like, having minimized height while being broader in a dimension which is not critical in a space-saving design.

BRIEF DESCRIPTION OF THE DRAWINGS

These and other features and advantages of the present invention will be more fully understood by reference to the following detailed description in conjunction with the attached drawing in which like reference numerals refer to like elements and in which.

DETAILED DESCRIPTION OF AN ILLUSTRATIVE EMBODIMENT

Figure 1:
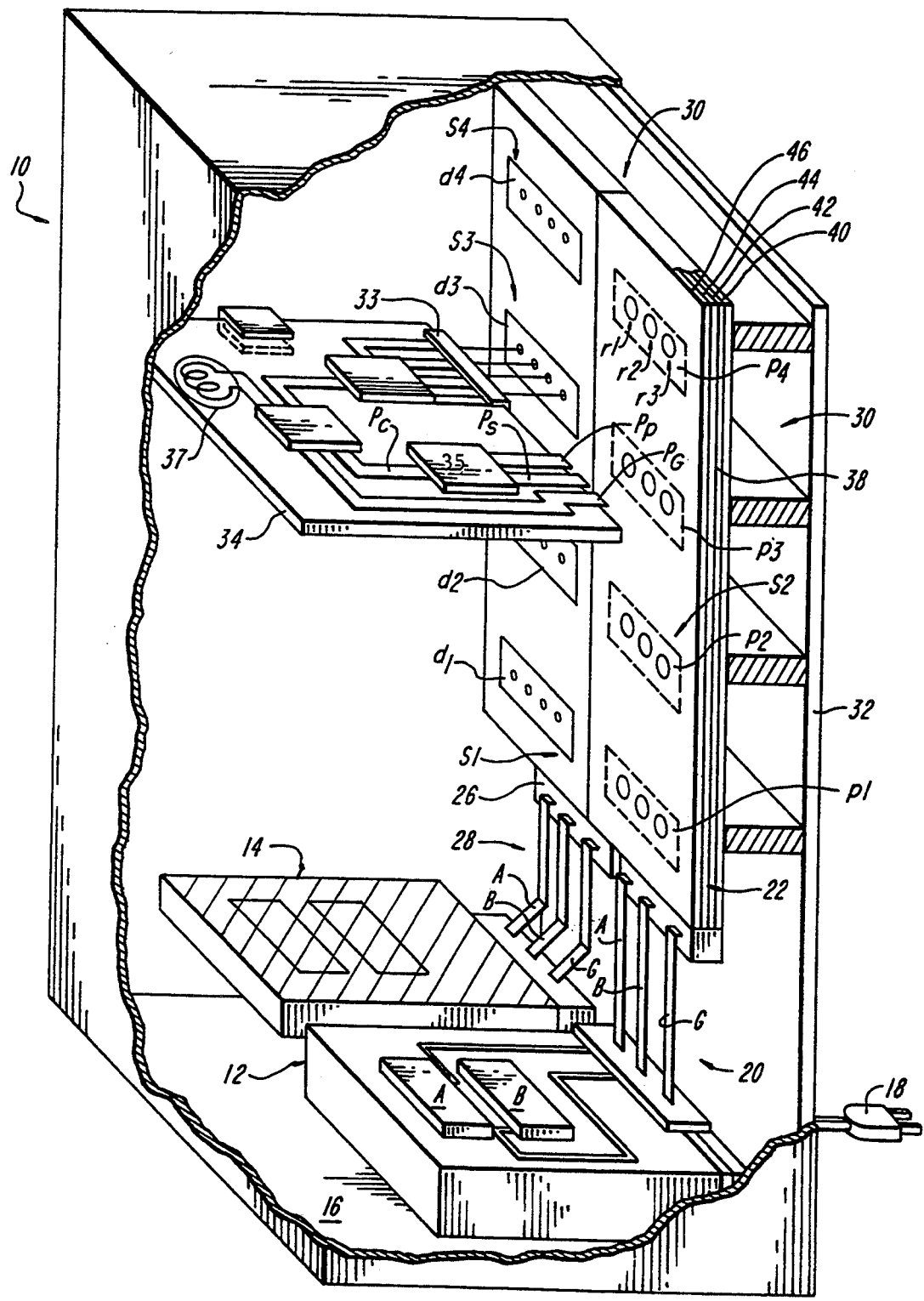
FIG. 1 is a partially exploded side perspective view of a computer rack system of the invention, with portions of the rack cabinet broken away for ease of description herein.

An illustrative embodiment of the invention is shown in FIG. 1 where a fault-tolerant computer system 10 includes a power supply 12 and a central processor unit (CPU) 14 mounted in computer cabinet 16. The power supply receives external power via connector 18 and then provides two independent system power sources ("A" and "B") and system ground ("G") via cable assembly 20 to system power Bus 22. CPU 14 receives the system power (A and B) and ground G via cable assembly 24. System data is coupled from CPU 14 to a system data bus 26 via cable assembly 28. Busses 22, 26 form backplane assembly 30, which is mounted on computer rack sidewall 32.

A plurality of slots s1–s4 is defined on backplane assembly 30 for receipt of edge connectors of cooperating electronic devices, such as edge connector 33 of fault-tolerant electronic (e.g., memory) card 34. Slots s1–s4 define a plurality of power ports p1–p4 and data ports d1–d4. The system power bus 22 delivers system power from power supply 12 to the card(s) installed in the slot(s) via the associated power port(s), and the system data bus 26 delivers system data from CPU 14 to the installed card(s) via the associated data port(s). In the exploded view of FIG. 1, fault-tolerant electronic card 34 is shown as mounted in slot s3, with its multi-pin edge connector 33 disposed for coupling to data port d3 and power port p3.

Figure 2:
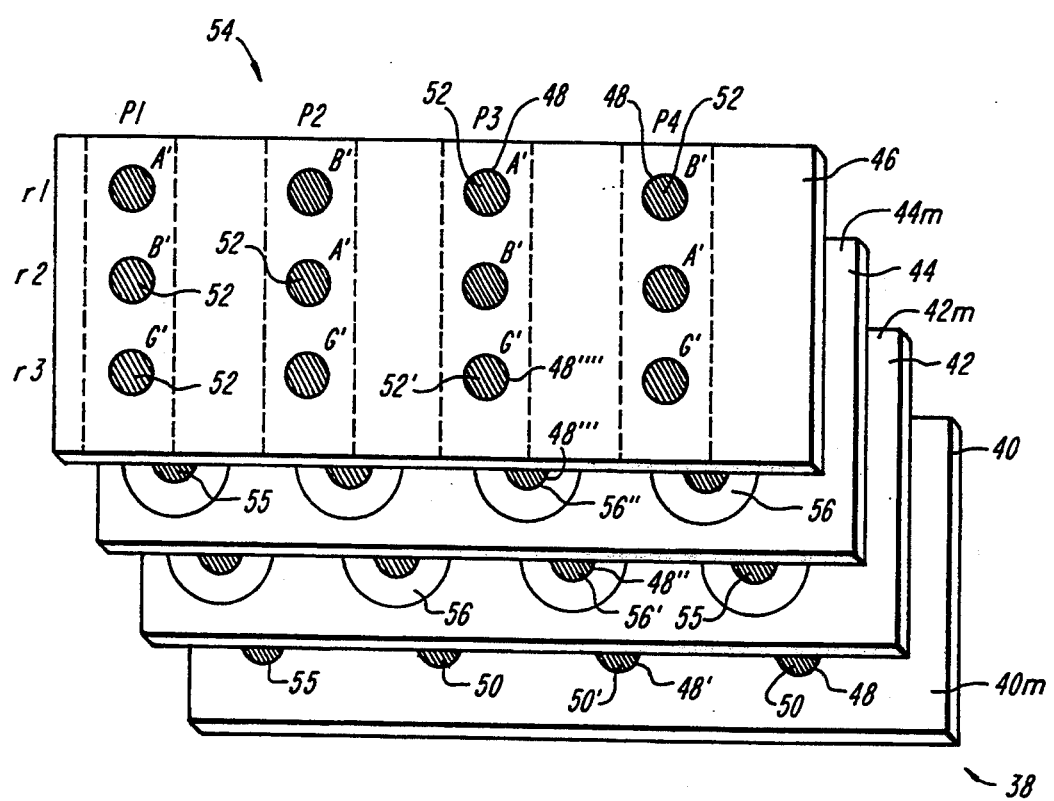
FIG. 2 is an exploded perspective view of a multi-layer, planar power bus assembly according to the invention.

System power bus 22 is formed as a multi-layer circuit board 38, a portion of which is shown in FIG. 2. These multiple layers are formed as several superimposed plates 40, 42, 44, 46. Backplate 40 is connected to ground G at power source 12. The next plate is B power plate 42 and is connected to the system B power source provided by power supply 12. The third plate is A power plate 44, and is connected to the system A power source also provided by power supply 12.

Each plate is formed with a plurality of viaways or perforations 48 and the plates are joined at aligned ones of these perforations via respective conductive pins 50 inserted therethrough. The pins terminate at the backplane faceplate or connection plate 46, in the form of a plurality of female contacts 52 in a matrix 54, shown in FIG. 2. The pins may be conductive rods or conductive tubes, or the like, wherein each includes a conductive circumference 55.

Matrix 54 defines the power ports p1–p4 of slots s1–s4 in a common system pinout configuration in three rows r1–r3 of female contacts 52. In this common system pinout configuration, primary power is always supplied at row r1, secondary power is always supplied at row r2 and a ground connection is provided at row r3, at each power port p1–p4. However, the primary power connection at row r1 of a first of the ports is to the A power bus and a secondary power connection at row r2 of that port is to the B power bus, while the primary power connection at row r1 of another of the ports is to the B power bus and the secondary power connection at row r2 of that port is to the A power bus. Others of the slots are also configured in a like alternating manner. Thus, various ones of fault-tolerant cards, such as card 34, may be installed, and they will receive primary power either from the system A or B power source according to the slot in which the card is installed, as part of an overall fault-tolerant power distribution strategy.

It will therefore be appreciated that system power bus 22 prioritizes delivery of the A and B system power to respective ones of the power ports in a manner in which A power is provided as a primary power source for one set of installed cards and B power is provided as a backup or secondary power source, while in a second set of the cards, B power is provided as the primary power source and A power is provided as the backup. This prioritized power delivery is provided in the common system pinout and is represented at respective ports by the prime designations A', B', G' and B', A', G', shown in FIG. 2.

The edge connector of each card, such as edge connector 33 of card 34, is provided with a primary power receiving contact Pp, a secondary power receiving contact Ps and ground contact Pg in the common system pinout. These contacts Pp, Ps, Pg, are male contacts and cooperate with the female contacts 52 of pins 50. Thus, as shown, card 34 receives system A power from port p3, row r1, via female contact A', as primary power via the card's male primary power contact Pp, and receives system B power as secondary power at the card's male secondary power contact Ps via female contact B' in row r2 of port p3. A similar result obtains at port p1. However, a card 34 inserted at ports p2 and p4 would receive system B power as primary power and system A power as secondary power at rows r1 and r2, respectively. All cards receive ground at row r3.

In order for provision of alternative power sources to the card to be utilized, each card 34 is further provided with a monitoring circuit 35 which outputs circuit power Pc for operation of the card circuitry. Monitoring circuit 35 uses system primary power as applied to the card's primary power pin Pp for primary circuit power Pc until it detects a fault in that system primary power. When such fault is detected, circuit 35 switches to system secondary power on its pin Ps for use as circuit power Pc. At the time of such switching, the card issues a warning signal to the CPU, or to an on-board indicator lamp 37, so as to alert the system operator.

Figure 3A:
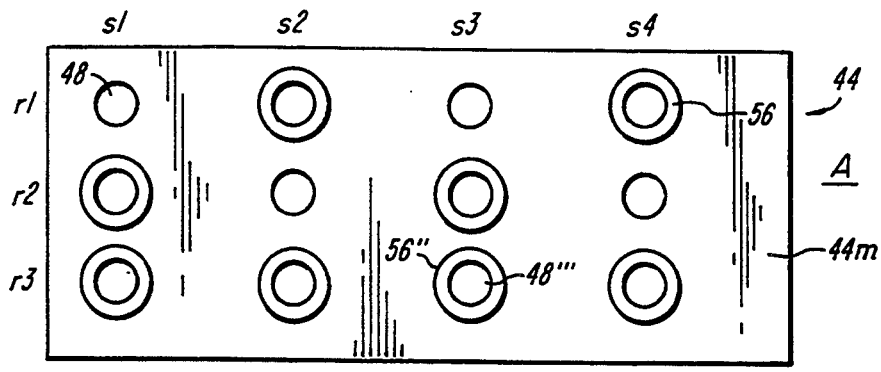
FIG. 3 (a-c) shows a metalization pattern of the invention.
Figure 3B:
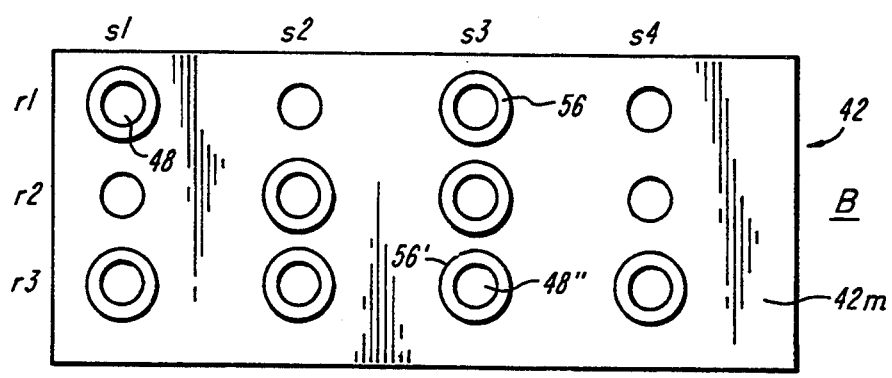
Figure 3C:
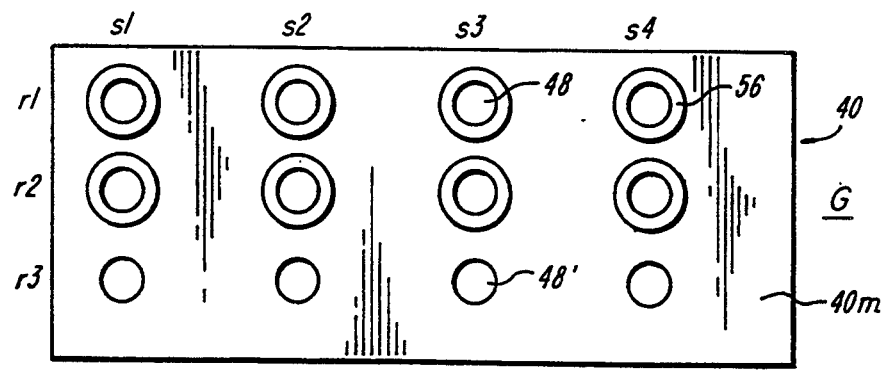

In order to achieve the power prioritization of the invention, each of plates 40, 42, 44 has a specially patterned metalization layer, 40m, 42m, 44m, respectively, formed on at least one side thereof. On each plate, its metalization extends up to or into selected ones of the plate's perforations. The metalization patterns of plates 40, 42 and 44 of this illustrative embodiment are shown in FIG. 3 (a-c).

Each metalization layer 40m, 42m, 44m, is applied in a specified pattern so as to obtain the pattern of circuit connections presented by the pin connector ends 52 at faceplate 46, and thus to obtain the desired power distribution prioritization. Generally speaking, the metalization pattern essentially is defined as a sea of conductive metalization with islands, or moats 56, encircling and electrically isolating selected ones of perforations 48.

It will now be appreciated, for example, that metalization layer 40m on ground plate extends up to a perforation 48' thereof, and makes electrical contact with the conductive circumference of pin 50' thereat. The contact end 52' of conductive pin 50' therefore provides a conductive path to contact Pg of card 34 inserted at port p3 from system ground via plate 40 metalization layer 40m. Moat 56' at perforation 48" on B power plate 42 isolates the now grounded pin 50' from the B power source as the pin passes through plate 42, and moat 56" at perforation 48"' on A power plate 44 isolates pin 50" from the A power source as the pin passes therethrough. Pin 50' then penetrates the unmetalized faceplate 46 at perforation 48"" to expose the pin's contact end 52. The remaining perforations, moats and pins function in a like manner to provide the desired system power prioritization pattern.

The present invention provides a multi-layer circuit board-like system power bus backplane arrangement in a low-profile, space-saving configuration. This arrangement has a low height dimension, dictated only by the height of its circuit board configuration, yet its width is increased substantially compared to a conventional power bus bar so as to still meet current density requirements.

In one practice of the invention, a 24 slot backplane supplied 200 volt-amps as A power, and 200 volt-amps as B power. In this embodiment, the width of the backplane was 3.5 inches, its length 33.75 inches, and each metalization layer was formed as a 0.090 inch thick copper plate on an insulating substrate of 0.060 inch epoxy/glass laminated sheet.

It will be further appreciated that various numbers and combinations of cards, devices, boards and the like may be installed in accordance with the invention, and that such system may have larger or smaller and greater or few numbers of plates, pins, ports and slots than described herein. Thus it will be understood that the above description pertains to only an illustrative embodiment of the present invention. That is, the description is provided by way of illustration and not by way of limitation. Still other variations of the disclosed embodiment may occur to the reader, and are governed by the following claims.

Having described the invention, what is claimed as new and secured by Letters Patent is:

1. System for delivering power to a plurality of electronic cards, said cards having electrical contacts in a common physical pinout for receipt of system power, said system comprising A. power plate means, comprising
   i) a first power-carrying bus plate for coupling to a first power source, and
   ii) a second power-carrying bus plate for coupling to a second power source,
B. port means comprising a plurality of ports for receiving said plurality of electronic cards, each said port including:
   i) a primary power contact at a primary position,
   ii) a secondary power contact at a secondary position, and
   iii) wherein said primary power contact and said secondary power contact are in said common pinout for interaction with said card electrical contacts, and
C. connection means for connecting said power plate means to said port means, said connection means connecting:
   i) said first power-carrying bus plate to said primary power contact of a first one of said ports, and
      said second power-carrying bus plate to said secondary power contact of said first port, and
   ii) said second power-carrying bus plate to said primary power contact of a second one of said ports, and
      said first power-carrying bus plate to said secondary power contact of said second port.

2. The system of claim 1 wherein said power plate means further comprises a ground bus plate for coupling to electrical ground, said connection means connecting said ground bus plate to said port means, each said port further comprising a ground contact at a third position, in said common pinout.

3. The system of claim 2 wherein each said plate comprises a metalized board, and each said board defines a plurality of perforations configured to cooperate with said ports in said common pinout.

4. The system of claim 3 wherein said connection means further comprises a plurality of conductive pins coupled to selected ones of said plates via respective ones of said perforations.

5. The system of claim 4 further comprising a plurality of motes of non-conductive material electrically isolating selected ones of said perforations from said pins.

6. The system of claim 5 wherein said port means further comprises a contact plate, wherein said ports are formed on said contact plate, and wherein said pins form said power contacts in said common pinout at said contact plate.

7. The system of claim 6 wherein each said port comprises means for providing primary power at said primary power contact and secondary power at said secondary power contact in said common pinout to a received one of said cards.

8. The system of claim 4 wherein each said pin is a conductive rod.

9. The system of claim 4 wherein each said pin is a conductive tube.

10. The system of claim 4 wherein said plates are formed as parallel circuit board layers of a multi-layer backplane.

11. The system of claim 2 further comprising a plurality of fault-tolerant electronic cards, each said fault-tolerant card having a primary power contact, a secondary power contact and a ground contact in said common pinout for cooperation with said primary power contact, said secondary power contact and said ground contact of said ports, each said fault-tolerant card having means for defining said system power received on a first of its power contacts as primary circuit power and said system power received on a second of its power contacts as secondary circuit power.

12. The system of claim 11 wherein a first one of said ports receives a first one of said fault-tolerant cards and couples said first power-carrying bus plate to said primary power contact of said received fault-tolerant card for defining said primary circuit power thereat and a second one of said ports receives a second one of said fault-tolerant cards and couples said second power-carrying bus plate to said primary power contact of said second received fault-tolerant card for defining said primary circuit power thereat, and each said port couples said ground plate to said ground contact of each said received fault-tolerant card.

13. The system of claim 12 wherein said port receiving said first fault-tolerant card couples said second power-carrying bus plate to said secondary power contact of said received first fault-tolerant card for defining said secondary circuit power thereat and said port receiving said second fault-tolerant card couples said first power-carrying bus plate to said secondary power contact of said received second fault-tolerant card for defining said secondary circuit power thereat.

14. The system of claim 13 wherein said first port is adjacent to said second port, and wherein a third one of said ports is adjacent to said second port for receiving a third one of said fault-tolerant cards and for coupling said first power-carrying bus plate to said primary power contact of said received third fault-tolerant card for defining primary circuit power thereat and for coupling said second power-carrying bus plate to said secondary power contact of said received third fault-tolerant card for defining secondary circuit power thereat.

15. The system of claim 11 wherein said power plate means supplies primary system power to each said received fault-tolerant card primary power contact and secondary system power to each said received fault-tolerant card secondary power contact.

16. The system of claim 15 wherein each said fault-tolerant card further comprises power switching means for using said primary system power at its primary power contact for said primary circuit power, and for detecting faults in said primary system power at said primary power contact and for using secondary system power at its secondary power contact for said primary circuit power upon detection of a fault in said primary system power.

17. The system of claim 1 wherein said connection means further comprises a plurality of conductive pins, wherein each of said plates has a metalization pattern thereon and ones of said pins selectively contact said metalization of selected ones of said metalization patterns.

18. Power distribution system, comprising a backplane having a power-carrying bus plate for coupling to a first power source, and referred to as an "A" power bus plate, and a second power-carrying bus plate for coupling to a second power source, and referred to as a "B" power bus plate, and power contact means including a plurality of pins passing through said plates, said pins forming first and second card connection ports in common pinout configurations, each said port having means for delivery of system primary power and system secondary power, respectively, wherein said pins define, for each said port, a primary power contact and a secondary power contact in said common pinout configuration, wherein said primary power contact of said first port is coupled only to said "A" plate and said secondary power contact of said first port is coupled only to said "B" plate, and wherein said primary power contact of said second port is coupled only to said "B" plate and said secondary power contact of said second port is coupled only to said "A" plate.

19. The system of claim 18 further comprising a ground bus plate associated with electrical ground, and each said port further comprising a third pin coupled to said third plate in said common pinout configuration, wherein each said plate comprises a metalized board defining a plurality of perforations extending therethrough for receipt of ones of said pins, and further comprising a backplane contact plate, wherein said pins terminate at said contact plate in said common pinout configuration, and further comprising motes of non-conductive material electrically isolating selected ones of said perforations from said pins.

* * * * *